United States Patent [19]

Shibata et al.

[11] Patent Number: 4,472,729
[45] Date of Patent: Sep. 18, 1984

[54] RECRYSTALLIZED THREE DIMENSIONAL INTEGRATED CIRCUIT

[75] Inventors: Kenji Shibata, Kawasaki; Tomoyasu Inoue, Tokyo, both of Japan

[73] Assignee: Tokyo Shibaura Denki Kabushiki Kaisha, Kawasaki, Japan

[21] Appl. No.: 411,011

[22] Filed: Aug. 24, 1982

[30] Foreign Application Priority Data

Aug. 31, 1981 [JP] Japan ................................ 56-135420

[51] Int. Cl.³ .......................................... H01L 27/04
[52] U.S. Cl. ...................................... 357/49; 148/1.5; 357/23; 357/42; 357/4; 357/59
[58] Field of Search ............... 357/23 TF, 59, 40, 42, 357/54, 49, 41, 4; 148/1.5

[56] References Cited

U.S. PATENT DOCUMENTS

| | | | |
|---|---|---|---|
| 3,564,358 | 2/1971 | Hähnlein | 357/40 |
| 4,314,858 | 2/1982 | Tomasetta et al. | 357/42 |
| 4,381,201 | 4/1983 | Sakurai | 357/91 |

FOREIGN PATENT DOCUMENTS

| | | | |
|---|---|---|---|
| 0930477 | 7/1973 | Canada | 357/42 |
| 55-147010 | 6/1980 | Japan | 357/42 |
| 55-160425 | 12/1980 | Japan . | |
| 56-73697 | 6/1981 | Japan . | |
| 55-164059 | 7/1981 | Japan | 29/576 |
| 55-119212 | 3/1982 | Japan | 357/42 |

Primary Examiner—William D. Larkins
Assistant Examiner—Charles S. Small, Jr.
Attorney, Agent, or Firm—Oblon, Fisher, Spivak, McClelland & Maier

[57] ABSTRACT

A stacked semiconductor IC device is disclosed which comprises a single-crystalline semiconductor substrate having planar surfaces with different height and a slant surface, a single-crystalline semiconductive layer which is epitaxially grown from the substrate on or above the substrate, and which has planar surfaces with different height and a slant surface and a substantially uniform thickness, groups of semiconductor elements each formed on the low planar surface of the substrate and on the low planar surface of the layer, and contact wiring pattern passing through the slant portion of the layer to electrically connect the element groups.

11 Claims, 7 Drawing Figures

RECRYSTALLIZED THREE DIMENSIONAL INTEGRATED CIRCUIT

BACKGROUND OF THE INVENTION

The present invention relates to a semiconductor integrated circuit (IC) device including a plurality of semiconductor elements, and more particularly to a semiconductor IC device in which semiconductor elements are formed on stacked semiconductive layers.

In a technology for integrating a number of semiconductor active elements in a high density on a semiconductive substrate such as a silicon substrate, it is one of the most important subjects now pending in this field to improve the integration density and the operating speed of an IC device. It can be expected that an IC device with multiple functions such as memory, operation, sensing, and display is realized when the problem is solved. As will readily be seen by those skilled in the art, if the discrete semiconductor elements formed on the substrate are smaller in size, the integration density and the operating speed of the device can be improved in principle. Actually, however, in making the elements much smaller in size, there is encountered a limit in the size reduction from the standpoint of the fabricating techniques at the present stage. Even if the problem of such limit in the size reduction is solved, however, many other problems arising from the small structure of the device are still involved in the device. For example, a physical limit on the channel region length of a metal-oxide semiconductor field-effect transistor (MOSFET) inherently causes an operation voltage of the device to be set at an unsatisfactory value and/or an undesirable high electrical field is developed between the source and drain of the electrodes of the MOSFET. The result is that an electronic avalanche phenomenon tends to take place. Therefore, the threshold voltage of the MOSFET is unstable. This is an undesirable matter in the semiconductor IC device.

For solving such problems arising from the integrating fabrication of semiconductor elements, there has been proposed three dimensional or cubic semiconductor IC devices with stacked semiconductor layers, as disclosed in Japanese Patent Disclosure (KOKAI) No. 55-160425, for example. A fundamental technique for fabricating such a device, which has been proposed, is that energy radiation or beam is radiated on the poly-crystalline or amorphous semiconductor layers formed on an insulating substrate to form poly-crystalline or single-crystalline semiconductor layers having relatively large grain size. Such a technique is disclosed in Japanese Patent Application Nos. 56-31044, 56-31045 or 56-31046.

In the prior stacked semiconductor IC device mentioned above, it is difficult to form a stable monocrystal layer on the stacked semiconductor layers in the fabricating process for forming the multilayered semiconductor IC device which uses the energy beam as the fundamental technique for fabrication. In the process of forming the single-crystalline layers, there is a great possibility that the stacked semiconductor layers are not converted to a single-crystalline layer and undesirably remain as a single-crystalline layer containing layer crystal grains with 20 to 100 μm diameters. In this case, it is difficult to set the crystal orientation of the semiconductor layers to the usually used plane (100) or (111). This is mainly due to the large height difference between the surface of the substrate and the surface of the insulating layer partially formed on the substrate. Therefore, the semiconductive layers formed are those with various crystal orientations. For the above background reason, the characteristic or performance of the prior stacked semiconductor IC device is inferior to that of the prior two-dimensional IC device. The production yield of such semiconductor devices is poor and fails to reach a practical level. Further, in the prior stacked IC device, it is very difficult to form conductive wiring making ohmic contacts among semiconductor elements formed on the upper and lower semiconductor layers at a production yield satisfying a practical requirement.

SUMMARY OF THE INVENTION

Accordingly, an object of the present invention is to provide a new and improved semiconductor IC device with a high integration density which can be formed at a high production yield and is capable of preventing deterioration of the performance or dynamic characteristic thereof.

Another object of the present invention is to provide a new and improved semiconductor device with a plurality of stacked semiconductive layers each with a plurality of semiconductor elements formed thereon and interconnected one another easily and satisfactorily.

A stacked semiconductor IC device according to the present invention is formed on a single-crystalline semiconductive substrate with a surface having high and low planar surfaces and a gently stepped or gentle slope surface for integrally connecting both planar surfaces. A group of semiconductor elements are formed on the low planar surface of the semiconductive substrate. Similarly, a single-crystalline semiconductive layer having high and low planar surfaces and a gentle slope surface is formed on the semiconductive substrate. For stacking the semiconductive layer, the higher planar surface of the layer overlies the low planar surface of the semiconductive substrate, aligning with the same. A group of semiconductor elements are formed on the low planar surface of the layer. The layer has a single-crystal structure resulting from the epitaxial growth given by irradiating an amorphous or poly-crystalline semiconductive layer in contact with the low planar surface of the substrate with energy radiation or beam. Therefore, the layer has substantially the same crystal orientation as that of the substrate.

BRIEF DESCRIPTION OF THE DRAWINGS

The present invention is best understood by reference to the accompanying drawings, in which.

DETAILED DESCRIPTION OF THE PREFERRED EMBODIMENT

Figure 1:
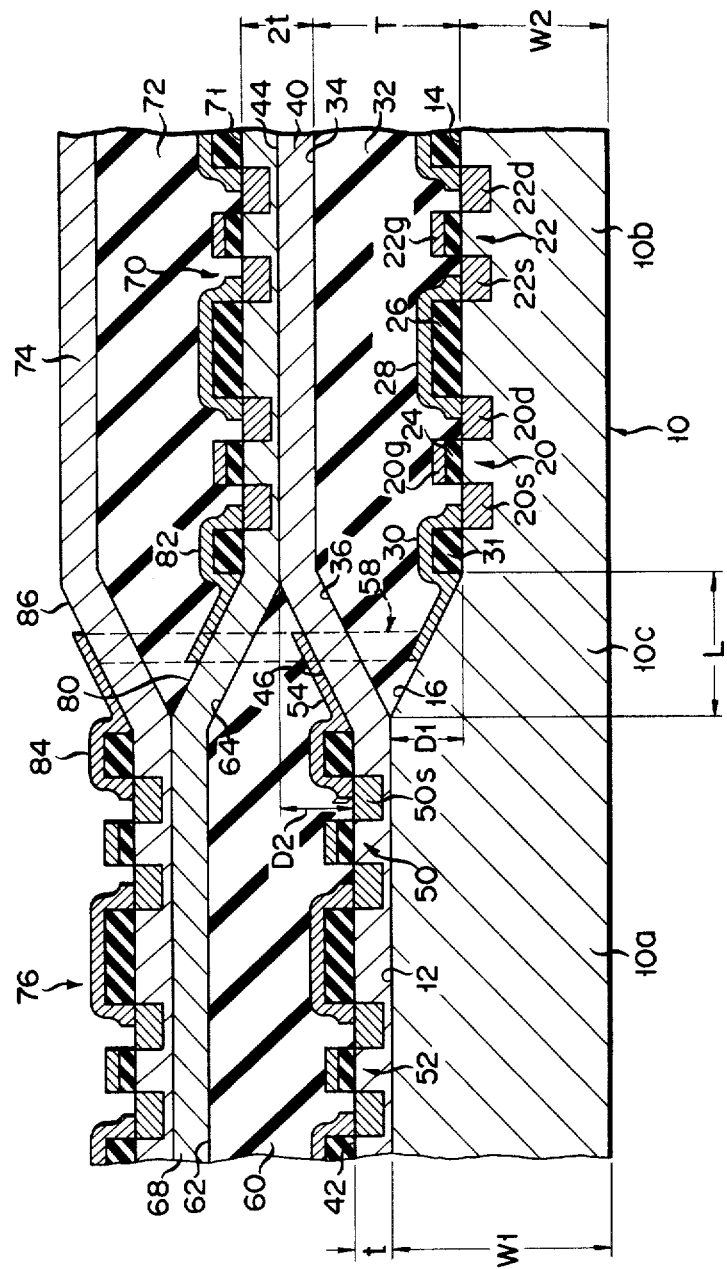
FIG. 1 illustrates, in schematic cross-section, a stacked semiconductor IC device which is an embodiment of the present invention.

Referring now to FIG. 1, there is illustrated an embodiment of a stacked semiconductor integrated circuit (IC) device according to the present invention. A substrate 10 is made of single-crystalline semiconductive material such as silicon. The single-crystalline substrate 10 has a given crystal orientation, for example, a plane (100). The substrate 10 is of the P-conductivity type, for example, and has a gentle slant surface of a gently stepped surface. That is to say, the substrate 10 has, at one part of the whole surface thereof, a surface area 12 expanding in a substantially planar fashion, and another surface area 14 expanding in the same way. The surface area 14 is lower than the other area 12. These two surface areas 12 and 14 of the substrate 10 are continuously and integrally coupled by a gentle slight surface 16. In other words, the substrate 10 essentially includes a substrate portion 10a with the surface 12 and a given thickness W1, a substrate portion 10b with the surface 14 and a thickness W2 smaller than the thickness W1 of the substrate portion 10a, and a substrate portion 10c located between the substrate portions 10a and 10b and with a thickness changed at a substantially fixed rate.

As described above, the substrate 10 has a surface containing a gentle slant surface of a gently stepped surface. The substrate surfaces 12 and 14 with different height are coupled with the slant surface 16 in the substrate portion 10c. Accordingly, the surface 12 is gently stepped down to the surface 14. A difference between the substrate portions 10a and 10b, i.e. a difference D1 between the surface 12 and the surface 14, and the length L of the substrate portion 10c may be properly selected to be preferably L≧D1 by workers skilled in the art so that slope of the slant surface 16 is not sharp.

A plurality of semiconductor active elements, for example, MOSFETs 20, 22, . . . , are formed on the surface 14 of the substrate portion 10b with a relatively thin thickness W2 of the substrate 10. One MOSFET 20 has diffusion layers 20s and 20d each serving as source and drain electrodes, a gate electrode 20g electrically insulated or isolated from the layers 20s and 20d by a gate oxide film 24. Similarly, another MOSFET 22 has a source electrode 22s, a drain electrode 22d and a gate electrode 22g. The MOSFETs 20 and 22 are electrically insulated from each other by a field insulation layer 26. A wiring pattern 28 for electrically connecting the MOSFETs 20 and 22 is formed on the field insulation layer 26. The wiring pattern is preferably made of high-melting metal material, such as Mo, W, MoSi$_x$(x=2 to 3), WSi$_x$ (x=2 to 3), which withstands the heat treatment. A wiring pattern 30 connected to the source electrode 20s of the MOSFET 20 such as a high-melting metal layer extends over a field insulation layer 31 formed on the substrate 10 adjacent to the electrode 20s and reaches up to above the slant surface 16 of the substrate portion 10c. The end of the wiring pattern 30 on the slant surface 16 is preferably positioned at the substantially center part of the slant surface 16.

An insulating layer such as silicon-oxide layer 32 is deposited on the aforementioned structure. The insulating layer 32 is substantially formed on the surfaces 14 and 16 of the substrate portions 10b and 10c. The portion of the insulating layer 32 positioned on the substrate portion 10b has a substantially uniform thickness T. The thickness T is preferably selected to be about two times a thickness difference between the substrate portions 10a and 10b, or the height difference D1 between the surfaces 12 and 14 (T≃2D1). The surface 34 of the insulating layer portion expands in a substantially planar fashion. The other portion of the insulating layer 32 located on and above the substrate portion 10c has a surface 36 slanted at a given angle. The direction of slant of the slant surface 36 is opposite to that of the slant surface 16 of the substrate 10. One end of the slant surface 36 of the insulating layer 32 essentially and substantially coincides with a line along which the surfaces 12 and 16 of the substrate portions 10a and 10c meet.

A semiconductive layer 40 made of a single-crystalline silicon is formed on the aforementioned structure, more precisely, on the surface 12 of the substrate portion 10a of the substrate 10 and the surfaces 34 and 36 of the insulating layer. The semiconductor layer 40 has a substantially uniform thickness t over the substantially entire area. Accordingly, the layer 40 is shaped in a gently slope having configuration given by the insulating layer 32 with the slope 36 and the substrate portion 10a. The semiconductive layer 40 has a surface 42 which is positioned higher than the surface 12 of the substrate portion 10a by the thickness of the layer 40, a surface 44 higher than the planar surface 34 of the insulating layer 32 by the thickness of the layer 40, and a slant surface 46 higher than the slant surface 36 of the insulating layer 32 by the thickness of the layer 40. Preferably, a height difference D2 between the surfaces 42 and 44 is substantially equal to the difference D1. A plurality of semiconductor active elements such as MOSFETs 50, 52,—are formed on the surface 42 of the single-crystalline silicon layer 40 thus structured, in a similar manner to the above-mentioned one. A metal layer 54 made of the high-melting metal material is connected to one electrode layer 50s of one MOSFET 50 positioned closest to the slant surface 46 of the single-crystalline silicon layer 40. The wiring pattern 54 extends on the slant surface 46 of the single-crystalline silicon layer 40. One end of the wiring pattern or metal layer 54 is preferably positioned at the about center portion of the slant surface 46. This end of the metal layer 54 is electrically connected, by means of a part of the conductive wiring 58, to one end of the metal layer 30 underlying the end of the layer 54 per se, through a part of the insulating layer 32 with the slant surface 36. Thus, a group of the MOSFETs 20, 22,—formed on the substrate 10 is made well to ohmic contact with another group of the MOSFETs 50, 52,—formed on the single-crystalline semiconductor layer 40 by the conductive wiring pattern 58 extending in a vertical direction. The wiring pattern 58 is passed through at least the layers 32 and 40 and is electrically insulated from the layer 40.

Another insulating layer 60 is further formed on the structure, more precisely, on the planar surface 42 and the slant surface 46 of the single-crystalline semiconductive layer 40 on which MOSFETs 50, 52,—are formed. The insulating layer 60 is formed in a similar manner so that of the insulating layer 40, and has a planar surface 62 and a slant surface 64. The slant surface 64 is directed in substantially the same direction as that of the slant surface 16 of the substrate 10 but in the opposite direction as that of the slant surface 46 of the semiconductive layer 40. The planar surface 42 of the semiconductive layer 40 is substantially alinged with the palanr surface 62 of the insulating layer 60. One end of the slant surface 64 substantially coincides with the line where the surfaces 46 and 44 of the single-crystalline semiconductive layer 40 intersect.

Similarly, the single-crystalline silicon layer 68 with the uniform thickness t and a semiconductor element group 70 including a plurality of MOSFETs are formed on the structure. A surface 71 of the silicon layer 68 on which the MOSFETs 70 are formed, are alinged with the substrate surface 14 underlying the surface 71 per se on which the MOSFETs 20, 22,—are formed. A height difference between the surfaces 71 and 14 is essentially expressed by T+2t. On the other hand, the height difference between the layer surface 42 on which MOSFETs 50, 52,—are formed and the substrate surface 14 is expressed by D1 and t. As described above, T≃2D1, and then the height difference between the layer surface 71 and the substrate surface 14 is set at a value which is substantially two times the height difference between the substrate surface 14 and the layer surface 42.

Further, the insulating layer 72, the single-crystalline silicon layer 74, and the semiconductor element group 76 including a plurality of MOSFETs are stacked on the aforementioned structure. A high-melting metal layer 82 connected to one of the MOSFETs 70 formed on the single-crystalline silicon layer 68, which is closest to the slant surface 80, extends to and on the slant surface 80. A high-metling metal layer 84 connected to one of the MOSFETS formed on the semiconductor layer 74, which is illustrated in the uppermost part of FIG. 1, extends to and on the slant surface 86 of the layer 74. The metal layers or wiring patterns 30, 54, 82 and 84 are all electrically interconnected by the single ohmic contact wiring pattern 58. While in the embodiment shown in FIG. 1, the substantially four layered IC device is illustrated by way of example, the number of the layers may be changed properly if necessary.

According to the stacked semiconductor IC device thus structured as an embodiment of the present invention, the semiconductor element group 70 is formed on the semiconductor layer 68, overlaying the element group including the semiconductor elements 20, 22,— formed on the substrate 10. On the semiconductive layer 40 in another area of the substrate 10, the group of the semiconductor elements 50, 52,—are formed to be located at the middle in height between the element group including the semiconductor elements 20, 22,—and the semiconductor element group 70. The substrate 10 has the gentle slant surface 16 and the insulating layer 32 has the slant surface 36. The semiconductive layers 40, 68 and 74 are stacked each having a gentle stepped portion and on and above the slant surfaces. With such structure, the epitaxial growth for forming the semiconductive layers may be made effective, so that the semiconductive layers have each a good crystalline structure with easily and desirably controlled crystal orientation. Thus, a good multilayered structure of single-crystalline semiconductive layers can be formed. This feature of the present invention has successfully solved the problems, for example, deterioration of its characteristics, arising from the microstructure of the semiconductor device, which are inherent to the prior art. Consequently, according to the present invention, the semiconductor IC device with a number of semiconductor elements integrated in a high density and with a good performance characteristic may be obtained.

According to the semiconductor IC device of this invention, the wiring pattern 58 for electrically connecting the stacked semiconductor element groups is formed substantially vertically extending only through the slant surface portions which correspond to those useless areas for the purpose of formation of semiconductor elements since it is essentially very difficult to form the semiconductor elements. Accordingly, the semiconductor elements such as transistors formed on the stacked semiconductor layers may be connected at a single location in the IC device of FIG. 1. Accordingly, a plurality of semiconductor elements may effectively be arranged, leading to an effective use of the limited substrate area.

Description of process steps for fabricating the IC device of FIG. 1 will be given hereinafter, for a clear understanding of formation of the semiconductor layers 40, 68 and 74 with good single-crystalline structure in the embodiment of FIG. 1.

Figure 2A:
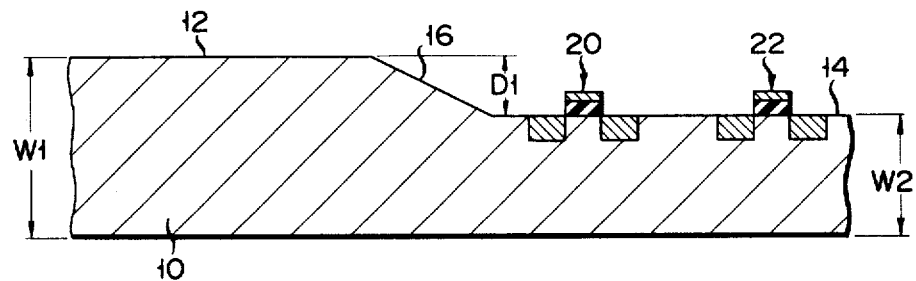
FIG. 2 illustrates, in schematic cross-section, some of the major steps in one example of a method of manufacturing the semiconductor IC device of FIG. 1.

First of all, in FIG. 2A, the single-crystalline silicon substrate is subjected at a part of the surface to the etching process to form the substrate 10 with a gently stepped surface. The height difference D1 between the two planar surfaces 12 and 14 is set at about 1 μm, for example. In the etching process, a boundary portion between the planar surfaces 12 and 14 are stepped not sharply but gently to form a gentle slope surface 16. The substrate 10 with a surface configuration in FIG. 2A may easily be formed using the called "taper etching process" known to those skilled in the art. This taper etching process is disclosed in H. Ono et al., "A New Technology for Tapered Windows in Insulating Films", J. Electrochem. Soc. Vol. 126, No. 3 (March 1979), pps 504–506, or L. B. Rothman et al., "Process for Forming Tapered Vias in SiO$_2$ by Reactive Ion Etching", Proceedings of the Symposium on Plasma Processing, 157th Meeting of the Electrochemical Society (Spring 1980), pps 193–198, for example.

A plurality of the semiconductor elements such as bipolar transistors, MOSFETs, MESFETs and/or diodes, for example, MOSFETs 20, 22,—in the present embodiment, may be formed on the portion with a relatively thin portion of the substrate 10, or the planar surface 14 by a suitable known process.

A suitable known process may also be used for forming on the structure shown in FIG. 2A the field insulation layers 26, 32,—and wiring patterns 28, 30,—as metal layers of the high-melting metal material. The metal layer 30 connected to the MOSFET 20 extends climbing the slant surface 16. Then, an amorphous insulating layer, for example, a silicon-oxide layer 32, is deposited on the surface 14 of the substrate 10 having the MOSFETs 20, 22,—formed thereon. The layer 32 may be a single silicon-oxide layer or an insulating layer with a multilayered structure having a silicon-oxide film and a silicon-nitride film, for example. One end of the insulating layer 32 in contact with the planar surface 12 of the substrate 10 is etched so as to have the slant surface 36. The etching method employed for this etching may be a glass-flow method involved in the taper etching process.

Figure 2B:
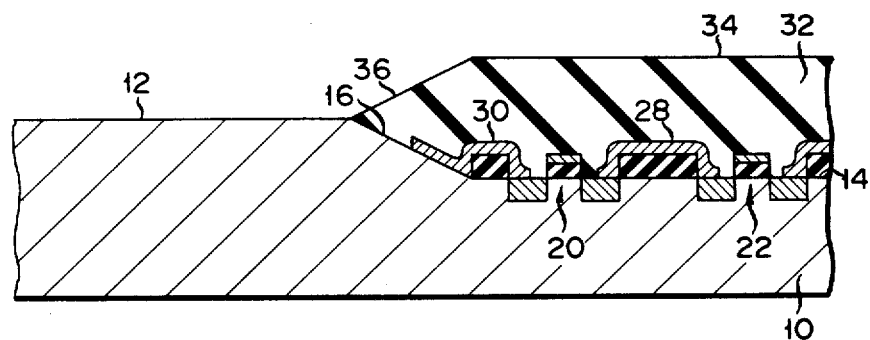
Figure 2C:
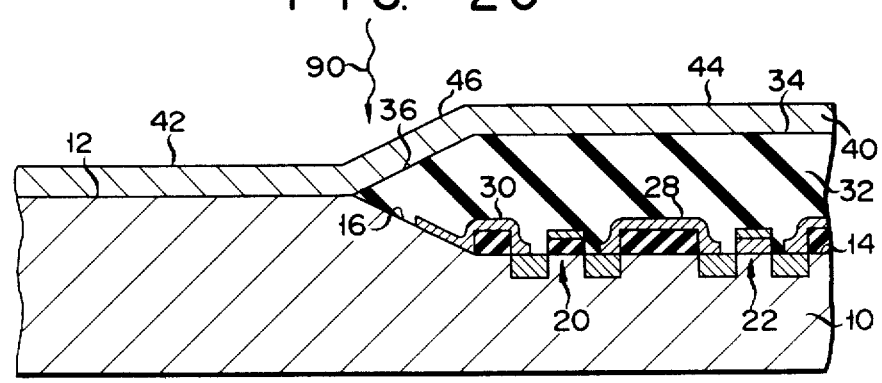

Amorphous or poly-crystalline silicon layer is deposited over the entire surface of the structure of FIG. 2B. Upon radiation of energy radiation beam 90 on the structure of FIG. 2C, an epitaxial growth from the single-crystalline silicon substrate 10 takes place in the amorphous or poly-crystalline silicon layer to finally form a single-crystalline silicon layer 40. In other words, the amorphous or poly-crystalline material is crystallized with the energy beam 90. Since the insulating layer 32 has the slant surface 36, the epitaxial layer grows well, resulting in formation of the single-crystalline silicon layer 40 with an excellent single-crystalline structure. Further, a crystal orientation of the single-crystalline silicon layer 40 may be controlled easily and at high production yield so as to have a plane (100) or (111). In the present embodiment, a continuous electron beam as the energy beam 90 used in the present embodiment was specified with: several KV to 30 KV, preferably 10 KV, for an acceleration voltage of the electron beam; 5 mA to several μA, preferably 300 μA, for the beam current reaching the silicon substrate 10; 300 μm to 50 μm for the spot diameter of the beam; and 50 to 200 cm/sec, preferably 100 cm/sec, for the scanning speed of the beam. For distinctively obtaining the effects of the present invention, at the time of beam radiation, the same area of the substrate surface is continuously and repeatedly scanned with the beam several times, preferably two times, while the substrate temperature is kept at 400° C. to 500° C.

Figure 2D:
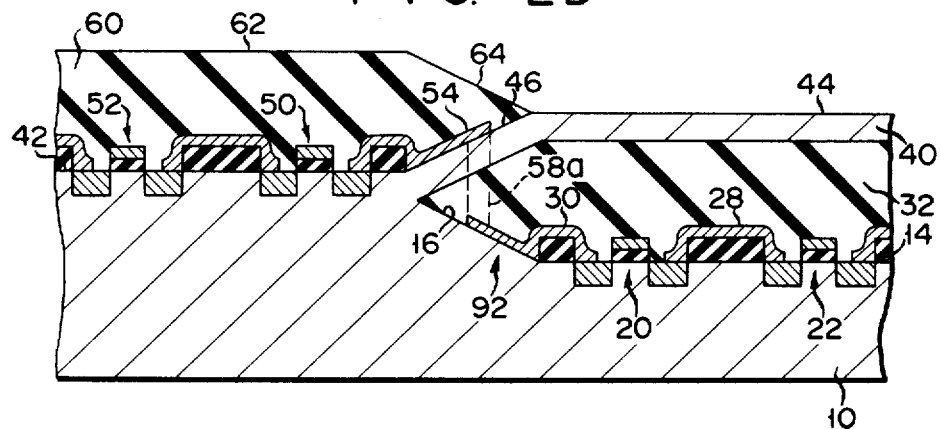

Subsequently, as shown in FIG. 2D, the semiconductor elements such as MOSFETs 50, 52,—are formed on the planar surface 42 of the single-crystalline silicon layer 40 formed by the epitaxial growth which is the lower, in a known process. The major carriers of the MOSFETs 50, 52,—are determined by the kind of doping material of the single-crystalline silicon layer 40 expitaxially grown. In the present embodiment, phosphor was doped at $1\times10^{15}$ cm$^{-3}$ into the expitaxial layer 40. As a result, the MOSFETs 50, 52,—of the R-conductivity type were formed on the planar surface 42. In the subsequent step, the field insulation layers, the wiring patterns and the insulating layer 60 are formed in succession in the substantially same manner as that of the step of FIG. 2B. In this case, the source and drain region of the MOSFETs 50, 52,—are formed by the boron diffusion process. The metal layer 54 as the wiring pattern connected to one MOSFET 50 extends up to the slant surface 46 of the single-crystal expitaxial layer 40. The insulating layer 60 is substantially aligned with the planar surface 42 of the silicon layer 40, and has the planar surface 62 overlying the planar surface 42 and the slant surface 64. The wiring pattern 58 is formed so as to electrically connect the metal layer 54 serving as the wiring pattern to the metal layer 30 also serving as the wiring pattern formed on the substrate 10. The wiring pattern 58 extends passing through the slant surface 92 vertically.

Figure 2E:
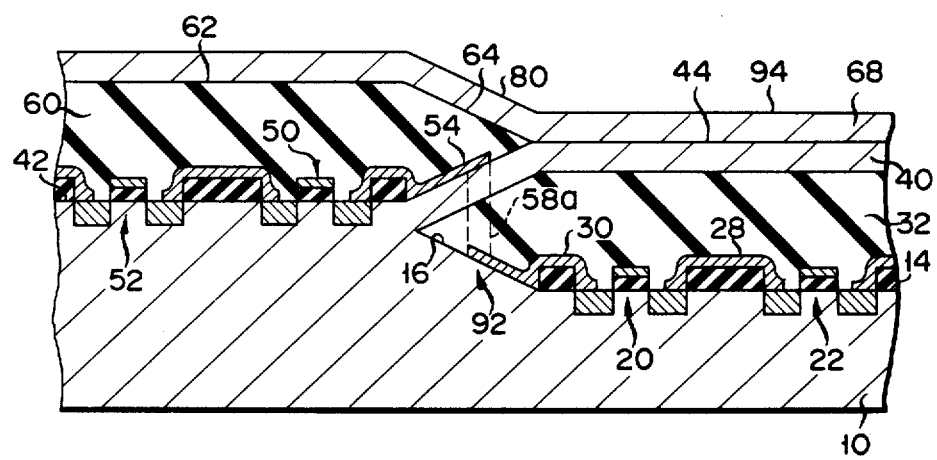

In the next step, as shown in FIG. 2E, the epitaxial silicon layer 68 with the single-crystalline structure is formed in a similar manner to that of the single-crystalline silicon layer 40. The layer 68 is epitaxially formed from the layer 40 so as to have the same crystal orientation as that of the single-crystalline silicon layer 40. In the step of FIG. 2E, semiconductor compound such as gallium arsenide (GaAs) may be used for the semiconductive layer 68. In this case, an amorphous or polycrystalline gallium arsenide layer is deposited over the structure of FIG. 2D by the vapor phase epitaxy process and is irradiated with electron beams, so that the single-crystalline GaAs layer hetero-epitaxially grows from the single-crystalline silicon layer 40.

Figure 2F:
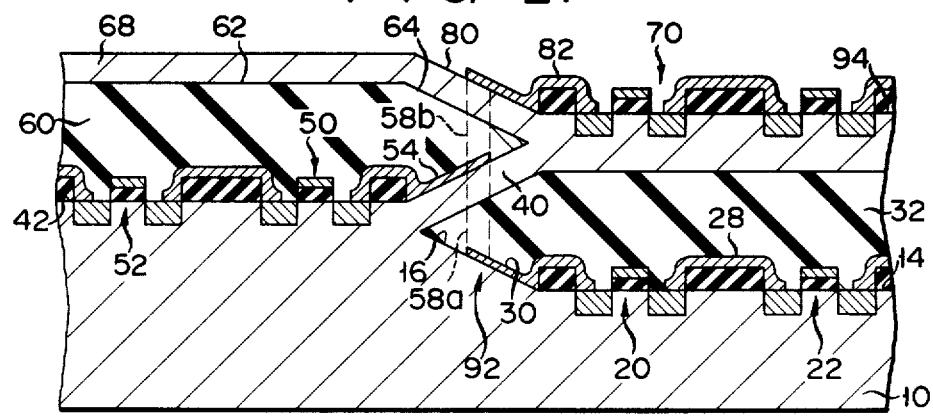

As shown in FIG. 2F, the MOSFETs 70 are formed, by the known manner, on the planar surface 94 of the single-crystalline semiconductive layer 68 which is the lower of the two. The metal layer 82 as the wiring pattern connected to one MOSFET is formed to extend up to the slant surface 80 of the epitaxial semiconductive layer 68. The wiring pattern 58b is formed such that the metal layer 82 is electrically connected to the metal layers 30 and 54 formed on the other semiconductive layers including the substrate. The pattern 58b vertically or perpendicularly extends through the slant surface portion 92 layered.

In a step of FIG. 2F, a single-crystalline GaAs layer is used for the epitaxial semiconductive layer 68 and the MOSFETs 70 may be formed on the layer. In this case, active elements can be obtained in which the mobility of carrier is higher than that in the single-crystalline silicon layer. If Gallium phosphor (GaP) semiconductor compound is used for the epitaxial semiconductive layer, the light emitting diode may easily be formed and contained in the semiconductor elements 70. If so done, the resultant semiconductor IC device may have a display function.

Through repeating the fabricating processes as mentioned above, the stacked IC device as one embodiment of the present invention shown in FIG. 1 may relatively easily be formed at a high production yield.

Although the present invention has been shown and described with respect to a particular embodiment, nevertherless, various changes and modifications which are obvious to a person skilled in the art to which the invention pertains are deemed to lie within the spirit, scope, and contemplation of the invention.

In the above-mentioned embodiment, the active elements such as MOSFETs 70 are fabricated on the surface 71 of the silicon layer 68, but these elements 70 may be fabricated on the surface 44 of the underlying silicon layer 40. In this case, it is not necessary that the silicon layer 68 is formed on the surface 44 of the silicon layer 40. As far as the layer 68 is face-contacted with the layer 40 over a predetermined suitable area required for the epitaxial growth, the silicon layer 68 can be formed to have the good single-crystalline structure. Further, in the embodiment, silicon as typical semiconductive material is used for the epitaxial semiconductive layers. Alternatively, the semiconductive material layer made of material, such as Ga, As, GaP, InP, InSb or Ge, other than the silicon, is hetero epitiaxially grown on the silicon substrate and various types of semiconductor elements may be formed on the layer formed. Use of the material further enhances the effects of the present invention. It is evident that other semiconductive material than silicon may be used for the substrate.

The electron beam for the energy radiation beam used in the fabricating process of the IC device of the present invention may be replaced by laser beam, infrared rays, and/or natural rays. The deposition of the layer and films may be made using any other suitable process of vapor deposition, vapor phase epitaxy, growth in plasma, molecular beam growth, or ion beam growth, if necessary.

What we claim is:

1. A semiconductor integrated circuit device with a plurality of semiconductor elements, comprising:

(a) a single-crystalline semiconductive substrate including a first substrate portion with a given thickness and a first surface extending in a substantially planar fashion, a second substrate portion with a less thickness than that of said first substrate portion and a second surface extending in a substantially planar fashion, and a third substrate portion which is located between and formed integrally with said first and second substrate portions and has a slant surface continuously coupling said first and second planar surfaces, a first group of semiconductor elements contained in said semiconductor elements being formed on said second surface; and (b) a semiconductive layer epitaxially grown from said substrate on said first surface of said substrate and having substantially a single-crystalline structure, said layer comprising a first layer portion on which a second group of semiconductor elements contained in said semiconductor elements is formed and which has a third surface extending in a substantially planar fashion, a second layer portion overlying said second substrate portion and with a fourth surface substantially parallel with said second surface, and a third layer portion integrally connecting said first and second layer portions and with a slant surface.

2. A device according to claim 1, further comprising wiring means for electrically connecting semiconductor elements in said first and second element groups, said wiring means comprising a first conductive layer which is electrically connected to at least one semiconductor element in said first element group and which extends on said slant surface of said third substrate portion, a second conductive layer which is electrically connected to at least one semiconductor element of said second element group and which extends on said slant surface of said third layer portion, and contact means for passing through said third layer portion and for electrically connecting said first and second conductive layers.

3. A device according to claim 2, further comprising an electrically insulative layer provided between said second and third substrate portions of said substrate and said second and third layer portions of said layer overlying said second and third substrate portions.

4. A device according to claim 3, wherein said contact means included in said wiring pattern means extends passing through said electrically insulative layer.

5. A device according to claim 3, wherein said second layer portion is substantially aligned with said second substrate portion.

6. A device according to claim 5, wherein said electrical insulative layer includes an insulative layer portion sandwiched between said second substrate portion of said substrate and said second layer portion and having a thickness substantially two times a height difference between said first surface and said second surface of said substrate.

7. A device according to claim 6, wherein said layer is formed through the epitaxial growth caused by irradiating with energy radiation a layer with a substantially uniform thickness and made of one of amorphous semiconductive material and poly-crystalline semiconductive material.

8. A device according to claim 7, wherein said substrate has a given crystal orientation and said layer has substantially the same orientation as that of said substrate.

9. A device according to claim 6, further comprising a fourth single-crystalline semiconductive layer epitaxially grown from said layer on said fourth surface of said second layer portion and with substantially the same thickness as that of said layer, said further layer comprising a fourth layer portion on which a third group of semiconductor elements contained in said semiconductor elements are formed and which has a fifth surface extending in a substantially planar fashion, a fifth layer portion overlying said first layer portion and with a sixth surface substantially parallel to said third surface, and a sixth layer portion integrally connecting said fourth and fith layers and with a slant surface.

10. A device according to claim 9, wherein said fourth layer portion of said further layer is substantially aligned with said second substrate portion and said second layer portion, and is formed such that a height difference between said fifth surface and said second surface is substantially two times that between said first and second surfaces.

11. A device according to claim 9, wherein said height difference between said first and second surfaces is preferably smaller than the length of said third substrate portion of said substrate.

* * * * *